United States Patent
Rogers et al.

(10) Patent No.: US 7,332,967 B2
(45) Date of Patent: Feb. 19, 2008

(54) VARIABLE GAIN AMPLIFIER WITH LOW PHASE VARIATION

(75) Inventors: John W. M. Rogers, Ottawa (CA); David G. Rahn, Greensboro, NC (US); A. David Moore, Carp (CA)

(73) Assignee: IPR Licensing Inc., Wilmington, DE (US)

( * ) Notice: Subject to any disclaimer, the term of this patent is extended or adjusted under 35 U.S.C. 154(b) by 0 days.

(21) Appl. No.: 11/034,224

(22) Filed: Jan. 12, 2005

(65) Prior Publication Data
US 2006/0164164 A1    Jul. 27, 2006

Related U.S. Application Data

(60) Provisional application No. 60/539,643, filed on Jan. 28, 2004.

(51) Int. Cl.
*H03F 1/14* (2006.01)
(52) U.S. Cl. ..................... 330/292; 330/254
(58) Field of Classification Search ............... 330/292, 330/254
See application file for complete search history.

(56) References Cited

U.S. PATENT DOCUMENTS

| | | | | |
|---|---|---|---|---|
| 5,384,501 A | * | 1/1995 | Koyama et al. | ............ 327/336 |
| 6,529,075 B2 | * | 3/2003 | Bruck et al. | ................ 330/252 |
| 6,566,961 B2 | * | 5/2003 | Dasgupta et al. | ........... 330/301 |

* cited by examiner

*Primary Examiner*—Robert Pascal
*Assistant Examiner*—Hieu Nguyen
(74) *Attorney, Agent, or Firm*—Volpe and Koenig, P.C.

(57) ABSTRACT

A VGA is provided that is designed to reduce or even eliminate entirely variations in phase response/shift with changes in gain. Compensation is made for parasitic capacitances of elements in the VGA that would otherwise cause variation in phase with changes in gain. An additional capacitance is introduced to the VGA to compensate for the sources of the parasitic capacitance. The technique for introducing the additional capacitance depends on the source of the parasitic capacitance being treated. The additional capacitance is introduced to one or more of transistor amplifier circuits in the VGA, wherein each transistor amplifier circuit has a different gain and one of the transistor amplifier circuits is selected depending on the desired gain of the VGA. These compensation techniques equalize the phase response of the transistor amplifier circuits (each having a different gain) so that regardless of which transistor amplifier circuit is selected, the phase shift will be substantially the same. These techniques may be applied to each VGA stage of a multi-stage VGA system.

21 Claims, 3 Drawing Sheets

FIG. 1
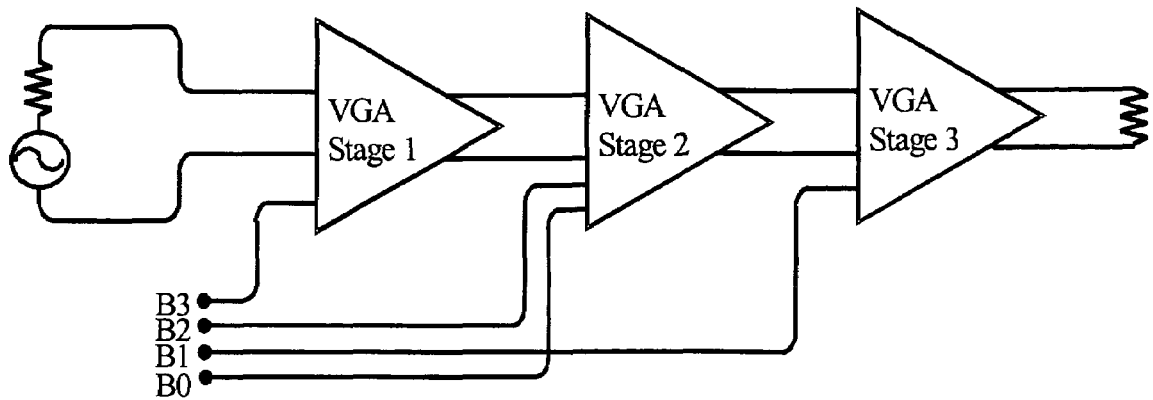
FIG. 2   Phase Compensation Applied to Equalize Phase Response for Load (Gain) States
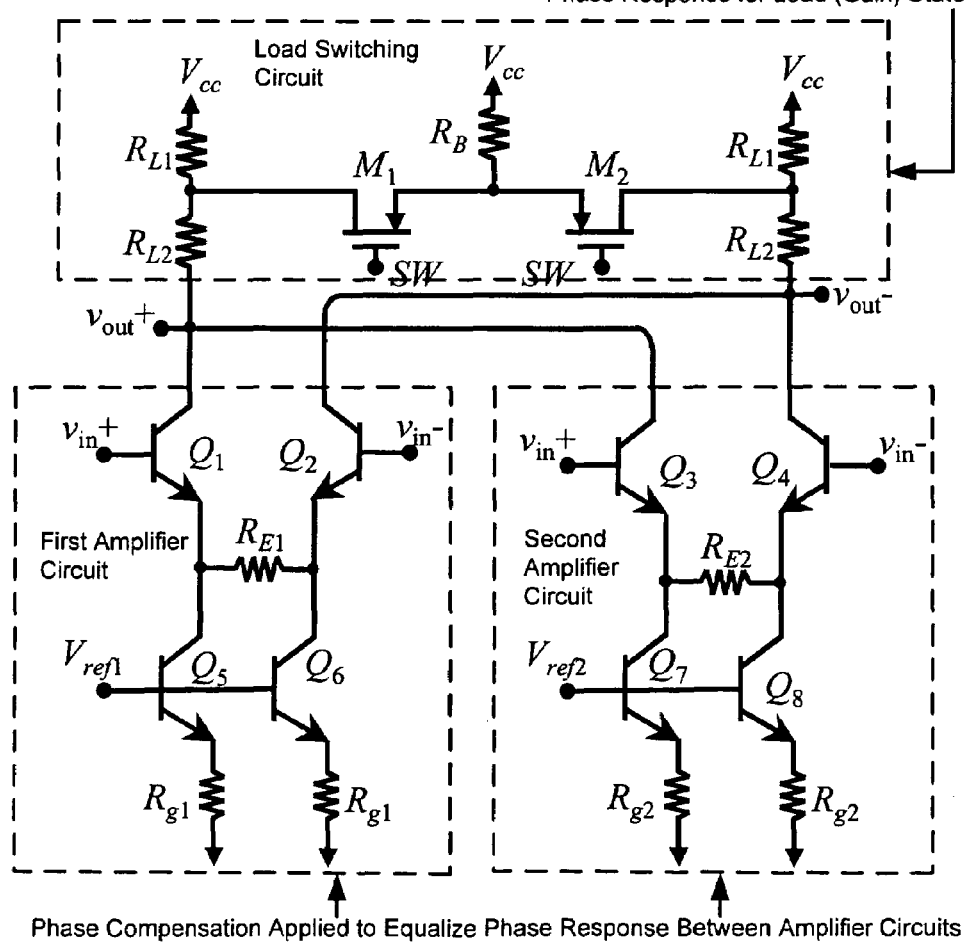
Phase Compensation Applied to Equalize Phase Response Between Amplifier Circuits

VARIABLE GAIN AMPLIFIER WITH LOW PHASE VARIATION

This application claims priority to U.S. Provisional Application No. 60/539,643, filed Jan. 28, 2004, the entirety of which is incorporated herein by reference.

BACKGROUND OF THE INVENTION

This application relates to a variable gain amplifier (VGA) with low phase sensitivity to changes in gain.

VGAs are required in a radio receiver to allow the receiver to handle an input signal with a large dynamic range without causing saturation of components in the back-end of the receiver. This is achieved by variably amplifying weak and strong input signals to a common voltage.

Recently, there has been increasing interest in multiple input multiple output (MIMO) radios. A MIMO radio transceiver has multiple transmitters and multiple receivers that operate simultaneously at a common local oscillator frequency. A radio link that employs MIMO algorithms processes transmit and receive signals from multiple paths to increase the range of reception and/or transmission data rates. In order to maximize the benefit of multiple receivers for some MIMO algorithms, the insertion phase of each receiver path needs to be calibrated so that the received signals are processed with phase coherency across receiver paths. If the phase shift through the radio path can be made insensitive to changes in gain then continual recalibration can be avoided as the path gain is varied. Therefore, the VGA should ideally have constant phase shift over all its gain settings.

SUMMARY OF THE INVENTION

Briefly, a VGA is provided that is designed to reduce or even eliminate entirely variations in phase response/shift with changes in gain. Compensation is made for parasitic capacitances of elements in the VGA that would otherwise cause variation in phase with changes in gain. An additional capacitance is introduced to the VGA to compensate for the sources of the parasitic capacitance. The technique for introducing the additional capacitance depends on the source of the parasitic capacitance being treated. The additional capacitance is introduced to one or more of transistor amplifier circuits in the VGA, wherein each transistor amplifier circuit has a different gain and one of the transistor amplifier circuits is selected depending on the desired gain of the VGA. These compensation techniques equalize the phase response of the transistor amplifier circuits (each having a different gain) so that regardless of which transistor amplifier circuit is selected, the phase shift will be substantially the same. These techniques may be applied to each VGA stage of a multi-stage VGA system.

The above and other objects and advantages will become more readily apparent when reference is made to the following description taken in conjunction with the accompanying drawings.

BRIEF DESCRIPTION OF THE DRAWINGS

FIG. 1 is a block diagram of an exemplary VGA having multiple variable gain amplifier stages.

FIG. 2 is a schematic diagram of a VGA stage.

DETAILED DESCRIPTION OF THE DRAWINGS

Figure 3:
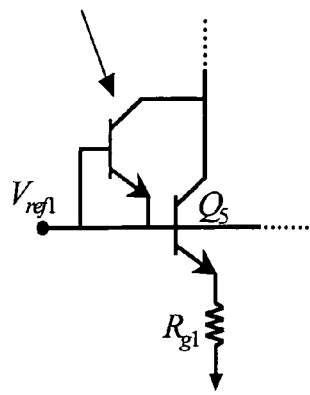
FIG. 3 is a schematic diagram illustrating a first technique for equalizing the phase shift through two transistor amplifier circuits in a VGA stage.

FIG. 1 shows a VGA comprising multiple gain stages. Each gain stage can be configured to have either two or four gain settings associated with it. The gain settings are controlled by digital voltage inputs, such as digital voltage input lines $B_0$, $B_1$, $B_2$ and $B_3$. These digital control lines draw negligible current and may be arranged such that the most significant bit corresponds to the largest gain step and the least significant bit corresponds to the smallest gain step.

FIG. 2 shows a schematic diagram of a basic VGA stage. Each VGA stage comprises (at least) two transistor amplifier circuits. For example, a first transistor amplifier circuit is comprised of the differential transistor pair $Q_1$, $Q_2$ (with their collectors tied together) and corresponding current source transistors $Q_5$ and $Q_6$. A second transistor amplifier circuit is comprised of the differential transistor pair $Q_3$, $Q_4$ (with their collectors tied together) and corresponding current source transistors $Q_7$ and $Q_8$. One transistor amplifier circuit will have a higher gain than the other transistor amplifier circuit. A digital input to a VGA stage controls which of the two transistor amplifier circuits is on by either giving $V_{ref1}$ or $V_{ref2}$ a non-zero value appropriate to properly bias one of the two differential pairs. Current flows through current source $Q_5$, $Q_6$ or $Q_7$, $Q_8$, but never through both $Q_5$, $Q_6$ and $Q_7$, $Q_8$ at the same time.

The gain G of the stage is given ideally by the ratio of the equivalent load resistance $R_L$ at the collectors and the degeneration resistors. Depending on which transistor amplifier circuit is on:

$$G = \frac{R_L}{R_{E1}} \text{ or } \frac{R_L}{R_{E2}} \tag{1}$$

Thus, the gain step is given by the ratio of the two degeneration resistors:

$$G_{\text{step 1}} = \frac{R_{E1}}{R_{E2}} \tag{2}$$

The load to each transistor amplifier circuit can also be switched to provide a total of four gain settings for a stage rather than only two. Two PMOS transistors $M_1$ and $M_2$ are included to adjust the total load resistance so that the gain can be stepped by the ratio of the sum of $R_{L1}$ and $R_{L2}$ (when the PMOS is off) to $R_{L2}$ (when the PMOS is on):

$$G_{\text{step 2}} = \frac{R_{L1} + R_{L2}}{R_{L2}} \tag{3}$$

The proceeding analysis was ideal, not accounting for the parasitic capacitance associated with either the current sources or the PMOS load switching transistors, which together are the two major sources of phase shift variation through a given VGA stage.

Accordingly, techniques are provided to equalize the phase response variation with gain levels of a variable gain amplifier. Phase shift (response) variation with changes in VGA gain is reduced or eliminated entirely by applying circuit techniques to compensate for the parasitic capacitance associated with the current sources or PMOS load switching transistors associated with the amplifier circuits. Additional capacitance is introduced to the VGA to compensate for the sources of the parasitic capacitance and thereby equalize (or at least substantially reduce the variation) of phase response with changes in gain of the VGA. The technique for introducing the additional capacitance depends on the source of the parasitic capacitance being treated. The additional capacitance is introduced to one or both (or all if more than two amplifier circuits are in a given stage) transistor amplifier circuits (each having a different gain) in the VGA and equalizes the phase shift of the transistor amplifier circuits so that regardless of which transistor amplifier circuit is selected, the phase shift will be substantially the same. These techniques may be applied to each VGA stage of a multi-stage VGA system.

Figure 4:
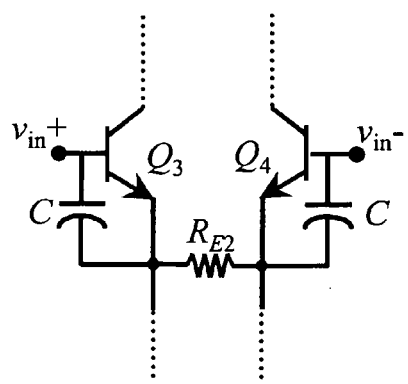
FIG. 4 is a schematic diagram illustrating a second technique for equalizing the phase shift through two transistor amplifier circuits in a VGA stage.
Figure 5:
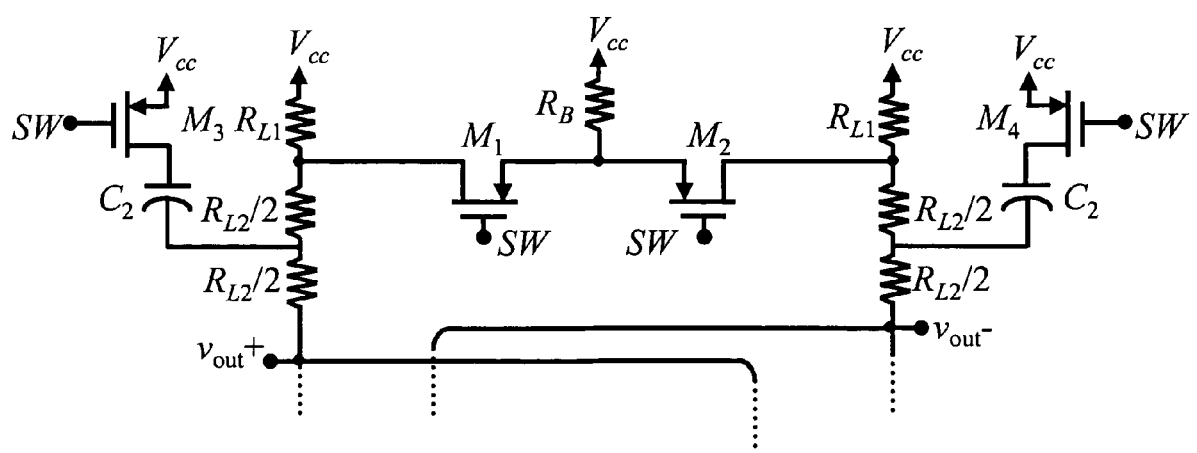
FIG. 5 is a schematic diagram illustrating a third technique for equalizing the phase shift through two transistor amplifier circuits in a VGA stage.

Examples of compensation techniques are described hereinafter in conjunction with FIGS. 3-5.

Phase Compensation Technique 1

The parasitic capacitances of the current sources are considered first. If the current sources $Q_5$, $Q_6$ and $Q_7$, $Q_8$ have an equivalent capacitance, $C_E$, associated with them, then the gain becomes:

$$G = \frac{R_L}{\frac{R_E}{1+sC_ER_E}} = \frac{R_L}{R_E}(1+sC_ER_E) \quad (4)$$

Consequently, the phase shift through a transistor amplifier circuit is given by:

$$\theta = \tan^{-1}(\omega C_E R_E) \quad (5)$$

where $\omega$ is the frequency of operation of the circuit. $R_E$ is different for the differential pairs in each amplifier circuit. Therefore, making the phase shift equal through both pairs requires scaling the capacitance such that:

$$C_{E1}R_{E1} = C_{E2}R_{E2} \quad (6)$$

Since both current sources will have the same associated capacitance, additional capacitance is added to the differential transistor pair ($Q_1$, $Q_2$ or $Q_3$, $Q_4$) of the transistor amplifier circuit having the higher gain (lower $R_E$) to ensure that the capacitance-resistance relationship above is met. One way of doing this is to add a dummy transistor (having an emitter coupled to its base) on the current source node of the differential transistor pair as shown in FIG. 3, or by any other convenient method.

Phase Compensation Technique 2

Alternatively, a capacitance may be placed in parallel with each of the input transistors ($Q_1$, $Q_2$ or $Q_3$, $Q_4$) to change the phase shift. If a capacitance C is placed in parallel with the input transistors as shown in FIG. 4, the gain of that differential pair can be approximated as:

$$G = \frac{-\frac{g_m R_L}{CR_E}}{s + \frac{(1+\beta)}{Cr_\pi}} \quad (7)$$

The phase shift through that differential pair is:

$$\theta = \tan^{-1}\left(\frac{\omega C r_\pi}{1+\beta}\right) \quad (8)$$

In this case, adding the capacitor C retards the phase rather than advances it. Consequently, this technique can be used as compensation on the lower gain transistor amplifier circuit, i.e., the differential pair with the higher $R_E$.

Phase Compensation Technique 3

The other major source of phase variation is the PMOS load switching transistors $M_1$ and $M_2$. When these transistors are switched on and off they contribute different capacitances to the circuit, thereby changing the phase shift. To make them small enough such that their capacitance is insignificant is not practical because small transistors have a very high turn-on resistance making them very poor switches. Therefore, an alternative technique is provided whereby a phase compensating network comprising additional switches and capacitances is introduced to the VGA stage. An example of such a phase compensating network is shown in FIG. 5.

Ignoring the additional switches $M_3$ and $M_4$, when the load switching transistors $M_1$ and $M_2$ turn on, the load resistance is simply:

$Z_{L\_Low} = R_{L2}$. When the PMOS transistor switches $M_1$ and $M_2$ turn off, the load resistance is:

$$Z_{L\_High} = R_{L2} + \frac{R_{L1}}{1+C_gR_{L1}s},$$

where $C_g$ is the capacitance associated with the PMOS transistors. Accounting for the additional switches $M_3$ and $M_4$, the low load resistance is given by:

$$Z_{L\_Low} = \frac{R_{L2}}{2} + \frac{R_{L2}}{2+C_2R_{L2}s},$$

while the high load resistance remains the same. Therefore, by selecting a proper size of capacitor $C_2$ such that $$\frac{C_2 R_{L2}}{2} = C_g R_{L1},$$

the phase shift (response) in both gain states (low resistance or high resistance) when either transistor amplifier circuit is selected can be equalized.

The foregoing compensation techniques are representative of techniques to provide compensation at each of the 3 (base, collector and emitter) terminals of an amplifier transistor (of in the case of a differential amplifier, the terminals of a differential pair).

Figure 6:
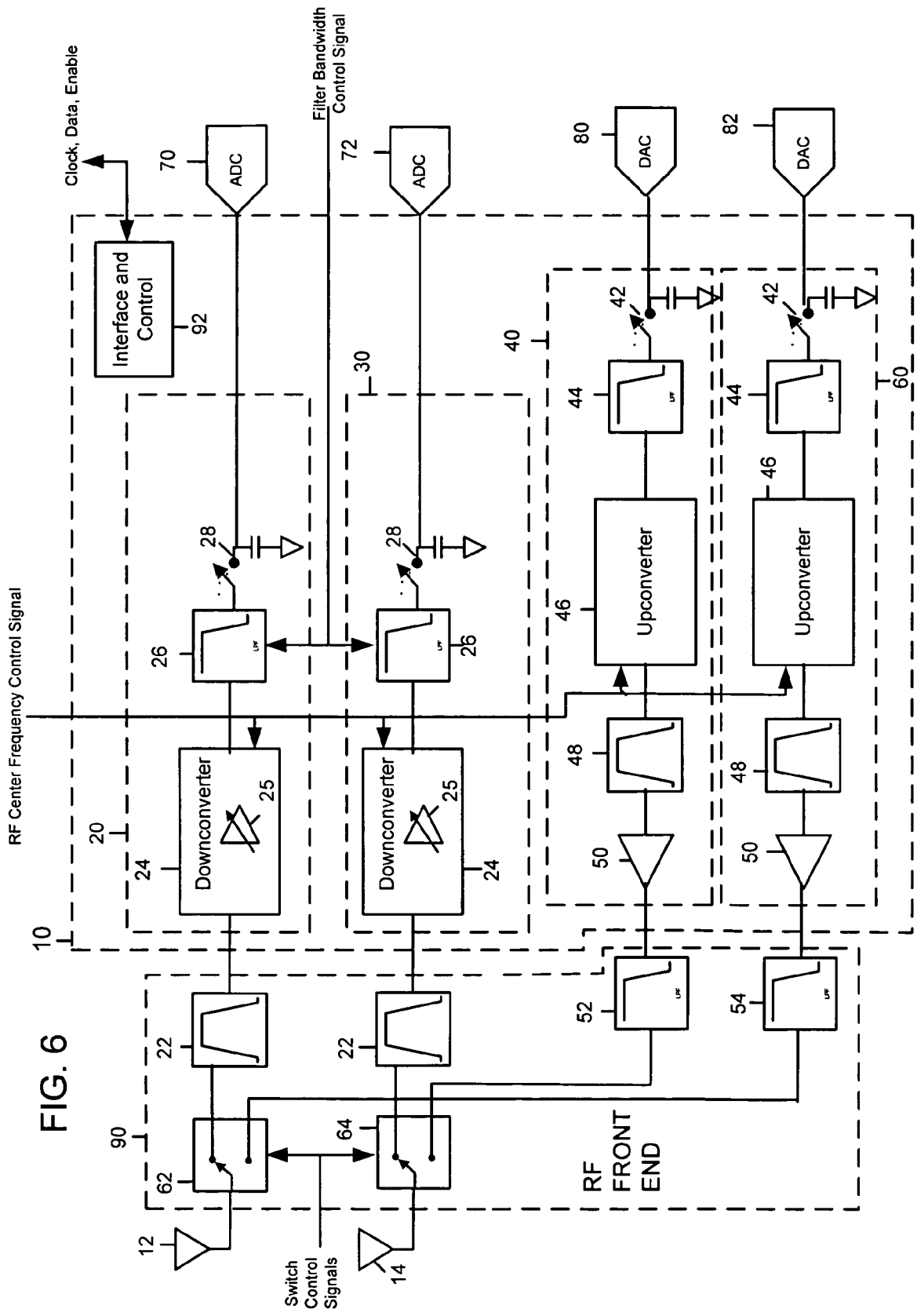
FIG. 6 is a block diagram of a MIMO radio transceiver that may employ the VGA phase compensation techniques.

FIG. 6 is a block diagram of a MIMO radio transceiver 10 in which the techniques described herein may be employed for the variable gain amplifiers 25 in the downconverters 24 of each receiver circuit 20 and 30. The radio transceiver 10 is suitable for processing radio frequency signals detected by at least two antennas, and is more fully described in co-pending U.S. application Ser. No. 10/065,388, filed Oct. 11, 2002, corresponding to U.S. Patent Publication No. 2003/0203743A1, the entirety of which is incorporated herein by reference. The variable gain amplifier design techniques described herein may also be applied to a VGA that is used in other parts of the radio transceiver, such as in VGAs used in the transmitter(s).

The radio transceiver 10 comprises a receiver and a transmitter. The receiver comprises receiver circuits 20 and 30. There is a receiver circuit or section 20 for antenna 12 and a receiver circuit or section 30 for antenna 14. Similarly, the transmitter comprises a transmit circuit 40 for antenna 12 and a transmit circuit 60 for antenna 14. Each receiver circuit 20 and 30 includes a downconverter 24, a variable lowpass filter 26 and a sample-and-hold circuit 28. Each transmit circuit 40 and 60 includes a sample-and-hold circuit 42, a low pass filter 44, an upconverter 46, a bandpass filter 48 and a power amplifier 50. The downconverters 24 may involve circuits to perform single-stage (direct) conversion to baseband or two-stage conversion to an intermediate frequency, then to baseband. Likewise, the upconverters 46 may upconvert directly to RF or to an intermediate frequency, then to RF. The precise connection locations of the variable gain amplifiers 25 depends on the conversion process employed and those connections are disclosed more fully in the aforementioned co-pending application.

A front-end section 90 couples the radio transceiver 10 to antennas 12 and 14. There are switches 62 and 64 coupled to antennas 12 and 14, respectively. Switch 62 selects whether the output of the transmit circuit 60 or the input to the receiver circuit 20 is coupled to antenna 12. Switch 64 selects whether the output of the transmit circuit 40 or the input of the receiver path 30 is coupled to antenna 14. There are bandpass filters 22 coupled to one switch terminal of the switches 62 and 64, respectively. In addition, there are lowpass filters 52 and 54 coupled between the output of the power amplifiers 50 in each transmit circuit 40 and 60, and, the other switch terminal of the switches 62 and 64, associated with antennas 12 and 14, respectively.

The outputs of the sample-and-hold circuits 28 of receiver circuits 20 and 30 are coupled to analog-to-digital converters (ADCs) 70 and 72, respectively. The inputs to the sample-and-hold circuits 42 in the transmit circuits 40 and 60 are coupled to digital-to-analog converters (DACs) 80 and 82, respectively. The DACs 80 and 82 may receive as input first and second digital baseband transmit signals to be transmitted simultaneously from antennas 12 and 14. The first and second transmitter circuits 40 and 60 process the first and second analog baseband signals for transmission substantially simultaneously. Likewise, antennas 12 and 14 may detect first and second receive signals, respectively, which are components of a single signal that was transmitted to transceiver 10. The first receiver circuit 20 and the second receiver circuit 30 process the first and second receive signals substantially simultaneously.

An interface and control block 92 is provided that interfaces the radio transceiver 10 with other components, such as a baseband processing section. For example, the interface and control block 92 receives a filter bandwidth control signal, a center frequency control signal, and switch control signals, all of which are used to control operation of certain components in the radio transceiver. Alternatively, the aforementioned signals may be sourced for a control processor or baseband section and coupled directly to pins that are tied to the appropriate components of the transceiver 10. The center frequency control signal controls the center frequency of the local oscillator signals used by the downconverters 24 in each receiver circuit 20 and 30 and of the upconverters 46 in each transmit circuit 40 and 60. In addition, the filter bandwidth control signal controls the cut-off frequency of the variable lowpass filters 26. The switch control signals control the position of the switches 62 and 64 depending on whether the transceiver 100 is receiving or transmitting.

The above description is intended by way of example only.

What is claimed is:

1. In a variable gain amplifier stage comprising a transistor amplifier circuit, a current source, and a load-varying circuit, a method for reducing phase variation accompanying changes in gain of the variable gain amplifier stage, the method comprising the step of compensating for phase variations introduced by one or more of the transistor amplifier circuit, the current source, and the load-varying circuit, where the load-varying circuit includes an element with parasitic capacitance that causes variation in phase with changes in gain.

2. The method of claim 1, wherein the step of compensating is performed in at least one of two transistor amplifier circuits in the variable gain amplifier so that the phase shift through each transistor amplifier circuit is substantially equal.

3. The method of claim 2, further comprising the step of compensating for phase differences between current sources in the two transistor amplifier circuits.

4. The method of claim 3, wherein the step of compensating for phase differences between current sources comprises adding capacitance to a current source node of one of the transistor amplifier circuits.

5. The method of claim 4, wherein the step of adding comprises adding capacitance to the current source node of the transistor amplifier circuit that has a higher gain.

6. The method of claim 3, wherein the step of adding a capacitance comprises adding a transistor on the current source node.

7. The method of claim 2, wherein the transistor amplifier circuits each comprise a differential transistor pair, and the step of compensating in at least one of two transistor amplifier circuits is performed in the differential transistor pair of at least one of the transistor amplifier circuits.

8. The method of claim 1, wherein the variable gain amplifier comprises a plurality of variable gain amplifier stages connected in series, and wherein the step of compensating is performed in each of the variable gain amplifier stages.

9. The method of claim 1, wherein the step of compensating comprises equalizing phase variation with gain levels of the variable gain amplifier.

10. The method of claim 9, wherein the step of reducing comprises equalizing the phase response of at least two amplifier circuits each of which has a different gain.

11. The method of claim 2, wherein the step of compensating in at least one of two transistor amplifier circuits comprises adding capacitance in parallel with an input transistor of one of the two transistor amplifier circuits.

12. The method of claim 11, wherein the step of adding comprises adding capacitance in parallel with the input transistor of the transistor amplifier circuit that has a lower gain.

13. The method of claim 1, wherein the phase variations introduced by the load-varying circuit are generated by a load switching transistor in the load-varying circuit.

14. The method of claim 13, wherein the step of compensating for phase variations introduced by the load switching transistor comprises coupling an additional capacitance to the load circuit of each of two transistor amplifier circuits.

15. The method of claim 14, wherein the step of compensating for phase variations introduced by the load switching transistor comprises coupling a switch between the additional capacitance and a voltage supply, wherein the switch controls when the additional capacitance takes effect to make the phase shift through each transistor amplifier circuit substantially equal.

16. A variable gain amplifier comprising:
  a. at least two transistor amplifier circuits each having a different gain;
  a load-varying circuit comprising a capacitance element that compensates for phase variation introduced by the load-varying circuit;
  and
  b. a circuit component connected to at least one of the transistor amplifier circuits so that the phase shift through each transistor amplifier circuit is substantially equal.

17. The variable gain amplifier of claim 16, wherein each transistor amplifier circuit has a current source, and wherein the circuit component comprises an additional capacitance element connected to the current source node of the transistor amplifier circuit having a higher gain.

18. The variable gain amplifier of claim 17, wherein the additional capacitance element comprises a transistor having an emitter coupled to its base.

19. The variable gain amplifier of claim 17, further comprising an additional capacitance element connected in parallel with an input transistor of the transistor amplifier circuit having a lower gain.

20. A variable gain amplifier system comprising a plurality of variable gain amplifiers of claim 17 connected in series.

21. The variable gain amplifier of claim 16, further comprising a switch connected between the capacitance element and a voltage supply, wherein the switch controls when the capacitance element takes effect.

* * * * *

UNITED STATES PATENT AND TRADEMARK OFFICE
CERTIFICATE OF CORRECTION

PATENT NO.       : 7,332,967 B2
APPLICATION NO.  : 11/034224
DATED            : February 19, 2008
INVENTOR(S)      : Rogers et al.

It is certified that error appears in the above-identified patent and that said Letters Patent is hereby corrected as shown below:

At column 2, line 66, before the word "analysis", delete "proceeding" and insert therefore --preceeding--.

At column 4, delete Equation (8) and insert therefore -- 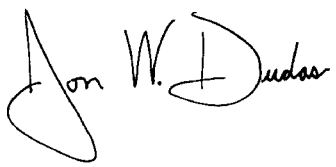 --

At column 4, line 66, before the words "in the", delete "of".

Signed and Sealed this

First Day of July, 2008

JON W. DUDAS
*Director of the United States Patent and Trademark Office*